US012732184B2

(12) United States Patent
Tamaki

(10) Patent No.: US 12,732,184 B2
(45) Date of Patent: Sep. 8, 2026

(54) SEMICONDUCTOR APPARATUS

(71) Applicant: Mitsubishi Electric Corporation, Tokyo (JP)

(72) Inventor: Koji Tamaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 7 days.

(21) Appl. No.: 18/822,068

(22) Filed: Aug. 30, 2024

(65) Prior Publication Data

US 2025/0240016 A1 Jul. 24, 2025

(30) Foreign Application Priority Data

Jan. 24, 2024 (JP) ............................ JP2024-008600

(51) Int. Cl.
*H03K 17/567* (2006.01)
*H03K 17/081* (2006.01)
*H03K 17/12* (2006.01)

(52) U.S. Cl.
CPC ......... *H03K 17/567* (2013.01); *H03K 17/122* (2013.01)

(58) Field of Classification Search
CPC ....... H03K 17/08104; H03K 17/08116; H03K 17/122; H03K 17/127; H03K 17/567; H03K 17/687
See application file for complete search history.

(56) References Cited

U.S. PATENT DOCUMENTS

2004/0178809 A1* 9/2004 Fujino ............... H02M 7/53871 324/710
2012/0099234 A1* 4/2012 Inoue ...................... H02M 1/08 361/87
2016/0020763 A1* 1/2016 Osanai ................ H03K 17/567 327/108
2018/0375508 A1* 12/2018 Morisaki ............ H03K 17/0822
2019/0372570 A1* 12/2019 Miyazaki ............ H03K 17/567

FOREIGN PATENT DOCUMENTS

JP 2017-175221 A 9/2017

* cited by examiner

*Primary Examiner* — Patrick O Neill
(74) *Attorney, Agent, or Firm* — Studebaker Brackett PLLC

(57) ABSTRACT

According to the present disclosure, a semiconductor apparatus comprises a first switching element including a high voltage terminal, a low voltage terminal, and a control terminal; a second switching element being connected in parallel to the first switching element and including a high voltage terminal, a low voltage terminal, and a control terminal; a drive circuit that drives the first switching element and the second switching element, by supplying a control signal based on potential of a GND terminal, to the control terminal of the first switching element and the control terminal of the second switching element; and a resistor connected between the low voltage terminal of the first switching element and the low voltage terminal of the second switching element. The GND terminal of the drive circuit is connected between the low voltage terminal of the second switching element and the resistor.

12 Claims, 4 Drawing Sheets

400
4
8
2a
Vo
Vge
12a
GND
14
10

600
4a
8
2
6a
12
16
10

SEMICONDUCTOR APPARATUS

BACKGROUND OF THE INVENTION

Field

The present disclosure relates to a semiconductor apparatus.

Background

JP 2017-175221 A discloses a technique by which, for the purpose of raising gate voltage of a switching element, emitter potential is lowered by providing an emitter unit of the switching element with a negative power supply.

However, this technique has a problem of being expensive and requiring a large space, because it is necessary to separately provide an external power supply to maintain the negative power supply.

SUMMARY

In view of the above-described problems, an object of the present disclosure is to provide a semiconductor apparatus capable of realizing a cost reduction and space saving.

The features and advantages of the present disclosure may be summarized as follows.

A semiconductor apparatus according to the present disclosure includes: a first switching element including a high voltage terminal, a low voltage terminal, and a control terminal; a second switching element being connected in parallel to the first switching element and including a high voltage terminal, a low voltage terminal, and a control terminal; a drive circuit that drives the first switching element and the second switching element, by supplying a control signal based on potential of a GND terminal, to the control terminal of the first switching element and the control terminal of the second switching element; and a resistor connected between the low voltage terminal of the first switching element and the low voltage terminal of the second switching element, wherein the GND terminal of the drive circuit is connected between the low voltage terminal of the second switching element and the resistor.

Other and further objects, features and advantages of the disclosure will appear more fully from the following description.

DESCRIPTION OF EMBODIMENTS

First Embodiment

Figure 1:
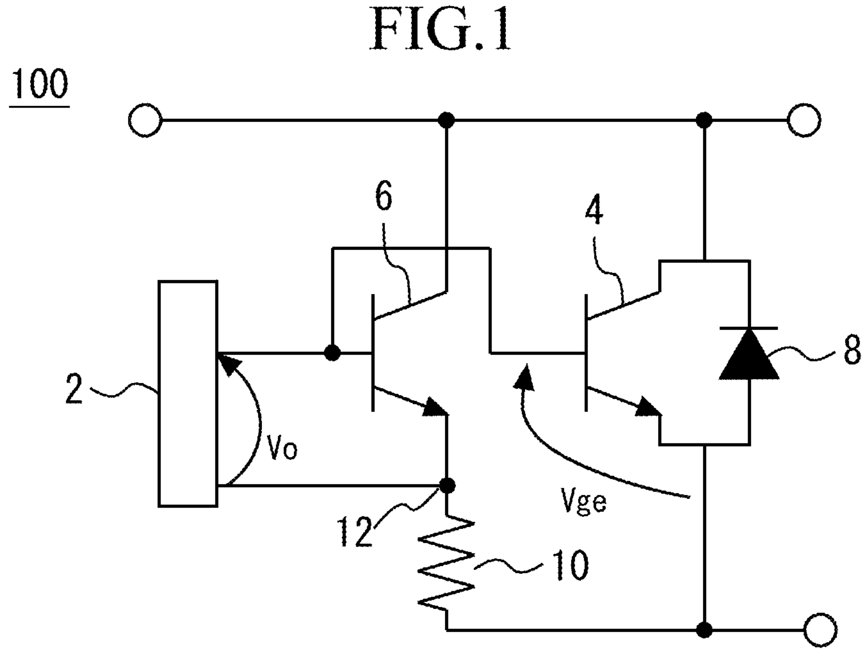
FIG. 1 is a drawing showing a semiconductor apparatus according to a first embodiment of the present disclosure.

FIG. 1 is a drawing showing a semiconductor apparatus according to a first embodiment of the present disclosure. A semiconductor apparatus 100 includes a first switching element 4. The first switching element 4 may be an IGBT, for example. The first switching element 4 includes a high voltage terminal, a low voltage terminal, and a control terminal. When the first switching element 4 is an IGBT, the high voltage terminal is a collector; the low voltage terminal is an emitter; and the control terminal is a gate. Between the emitter and the collector of the first switching element, a reflux element 8 is connected.

Although the present disclosure describes a mode in which the first switching element 4 is an IGBT, possible embodiments are not limited to this example, and the first switching element 4 may be a MOSFET, for example. When the first switching element 4 is a MOSFET, the high voltage terminal is a drain; the low voltage terminal is a source; and the control terminal is a gate. The same applies to a second switching element 6 and a third switching element 18 described later.

The first switching element 4 is connected in parallel to the second switching element 6. The second switching element 6 may be an IGBT, for example. The second switching element 6 includes a high voltage terminal, a low voltage terminal, and a control terminal. When the second switching element 6 is an IGBT, the high voltage terminal is a collector; the low voltage terminal is an emitter; and the control terminal is a gate.

Further, the semiconductor apparatus 100 includes a drive circuit 2. The drive circuit 2 is a circuit that drives the first switching element 4 and the second switching element 6. The drive circuit 2 drives the first switching element 4 and the second switching element 6, by supplying a control signal based on potential of a GND terminal 12, to the gate of the first switching element 4 and to the gate of the second switching element 6.

Between the emitter of the first switching element 4 and the emitter of the second switching element 6, a resistor 10 is connected. Between the second switching element 6 and the resistor 10, the GND terminal 12 is connected.

An example of operations of the semiconductor apparatus 100 will be explained. When the drive circuit 2 outputs ON signal voltage Vo for the first switching element 4 and the second switching element 6, the first switching element 4 and the second switching element 6 go into an ON state. In conjunction therewith, because a current flows through the resistor 10, a potential difference occurs between the two ends of the resistor 10.

In that situation, the emitter potential of the first switching element 4 is lower than the potential of the GND terminal 12. Accordingly, $Vo<Vge$ is true, where Vge denotes the gate voltage of the first switching element 4.

In switching elements in general, the higher the gate voltage is, the smaller is a resistance component between a collector and an emitter, and loss to be consumed is thereby reduced. According to the present embodiment, because it is possible to raise Vge relative to Vo, it is possible to reduce the resistance component between the collector and the emitter of the first switching element 4 and to thereby reduce loss to be consumed.

In addition, in switching elements in general, when a current caused to flow between a collector and an emitter reaches a specific current value, saturation occurs and it is no longer possible to cause the current to flow. The higher the gate voltage is, the larger is the specific current value. According to the present embodiment, because it is possible to raise Vge relative to Vo, it is possible to increase the current that is allowed to flow between the collector and the emitter.

As explained above, according to the present embodiment, by raising the gate voltage of the switching element without the need to provide a negative power supply, it is possible to realize a cost reduction and space saving.

Second Embodiment

Figure 2:
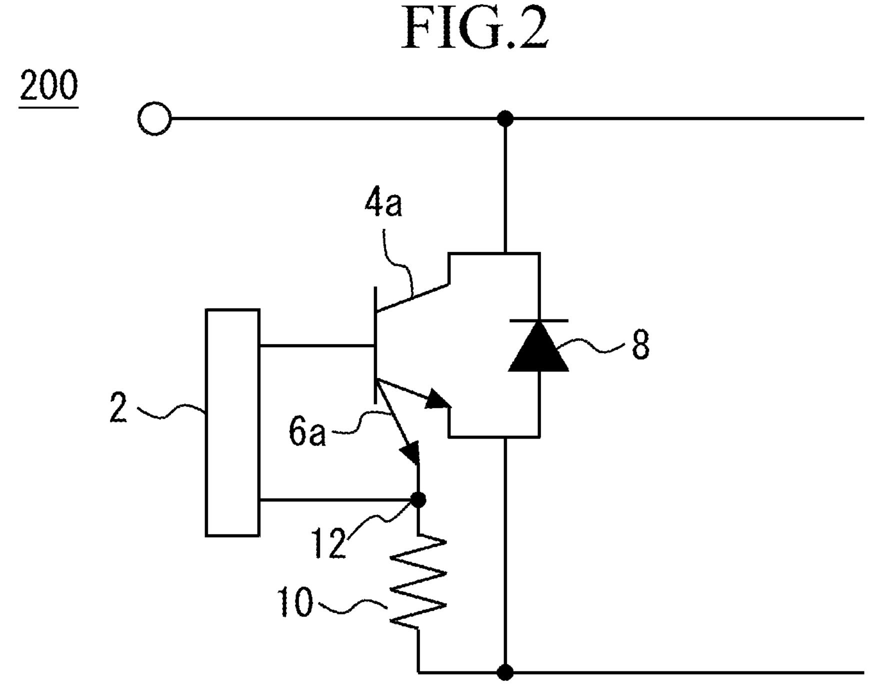
FIG. 2 is a drawing showing a semiconductor apparatus according to a second embodiment of the present disclosure.

FIG. 2 is a drawing showing a semiconductor apparatus according to a second embodiment of the present disclosure. A semiconductor apparatus 200 is different from the semiconductor apparatus 100 in that a second switching element 6*a* is built in a first switching element 4*a*.

According to the present embodiment, by raising the gate voltage of the switching element without the need to provide a negative power supply, it is possible to realize a cost reduction and space saving. In addition, according to the present embodiment, because the second switching element is built in the first switching element, it is possible to realize further space saving.

Third Embodiment

Figures 3, 4:
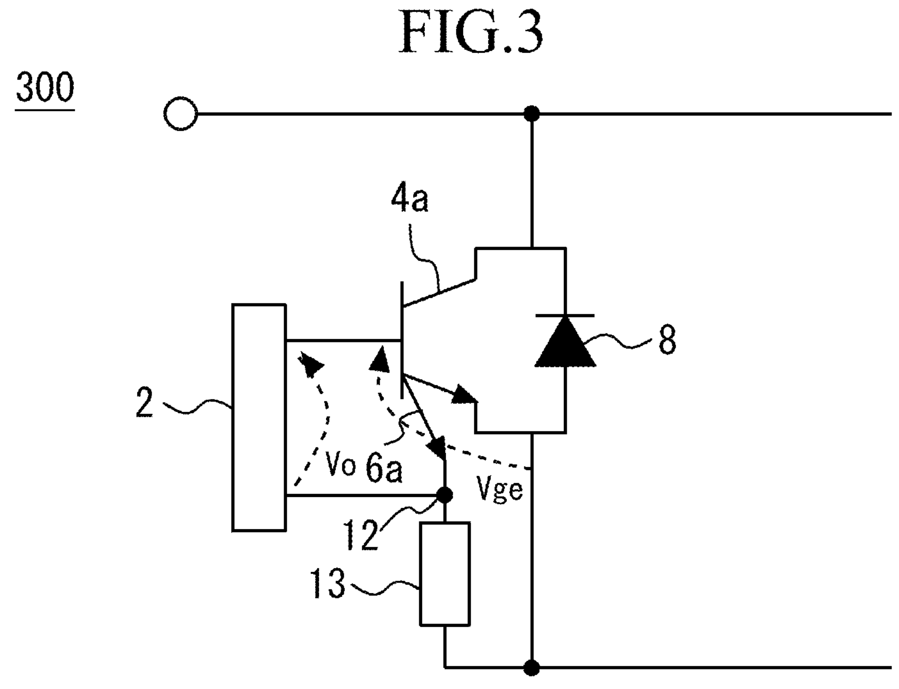
FIG. 3 is a drawing showing a semiconductor apparatus according to a third embodiment of the present disclosure.
FIG. 4 is a drawing showing a semiconductor apparatus according to a fourth embodiment of the present disclosure.

FIG. 3 is a drawing showing a semiconductor apparatus according to a third embodiment of the present disclosure. A semiconductor apparatus 300 is different from the semiconductor apparatus 200 in that a coil 13 is connected, in place of the resistor 10.

An example of operations of the semiconductor apparatus 300 when being turned on will be explained. When the drive circuit 2 outputs the ON signal voltage Vo for the first switching element 4*a* and the second switching element 6*a*, the first switching element 4*a* and the second switching element 6*a* go into an ON state. In conjunction therewith, because a current flows through the coil 13, electromotive force v ($v=L\cdot di/dt$) occurs.

In that situation, the emitter potential of the first switching element 4*a* is lower than the potential of the GND terminal 12. Accordingly, Vo<Vge is true, where Vge denotes the gate voltage of the first switching element 4*a*. Consequently, it is possible to reduce turn-on loss that may occur in the first switching element 4*a*.

In contrast, at the time of turning off the semiconductor apparatus 300, because the current stops flowing through the coil 13, back electromotive force −v($-v=L\cdot -di/dt$) occurs. In this situation, the ON signal voltage Vo for the first switching element is 0 V. Accordingly, Vo>Vge is true, where Vge denotes the gate voltage of the first switching element 4*a*. Consequently, it is possible to reduce turn-off loss that may occur in the first switching element 4*a*.

As explained above, according to the present embodiment, by raising the gate voltage of the switching element without the need to provide a negative power supply, it is possible to realize a cost reduction and space saving. In addition, according to the present embodiment, by using the coil in place of the resistor, it is possible to realize a further cost reduction.

Although the above describes the mode in which the coil 13 is connected, it is sufficient to use any element in which electromotive force occurs when a current flows therethrough. For example, it is acceptable to use a mode in which a wiring is connected.

Fourth Embodiment

FIG. 4 is a drawing showing a semiconductor apparatus according to a fourth embodiment of the present disclosure. A semiconductor apparatus 400 is different from the semiconductor apparatus 100 for including a drive circuit 2*a* which has a current source 14, in place of the drive circuit 2 and the second switching element 6. In this situation, the resistor 10 is connected between the emitter of the first switching element 4 and a GND terminal 12*a* of the drive circuit 2*a*.

An example of operations of the semiconductor apparatus 400 will be explained. When the drive circuit 2*a* outputs the ON signal voltage Vo for the first switching element 4, the first switching element 4 goes into an ON state. At the same time, the drive circuit 2*a* causes a current to flow in the direction from the GND terminal 12*a* toward the emitter of the first switching element 4, by employing the current source 14. As a result of the current flowing, a potential difference occurs between the two ends of the resistor 10.

In that situation, the emitter potential of the first switching element 4 is lower than the potential of the GND terminal 12*a*. Accordingly, Vo<Vge is true, where Vge denotes the gate voltage of the first switching element 4. Consequently, it is possible to reduce loss that may occur in the first switching element 4.

Further, the current source 14 is capable of varying the magnitude of the current caused to flow through the resistor 10. Accordingly, the semiconductor apparatus 400 is capable of adjusting a decrease amount for the emitter potential of the first switching element 4, i.e., an increase amount for the voltage between the gate and the emitter of the first switching element.

In addition, the current source 14 is able to vary the magnitude of the current caused to flow through the resistor 10, regardless of the magnitude of the current caused to flow through the first switching element 4. In other words, in the semiconductor apparatus 400, even when a small current is flowing through the first switching element 4, it is possible to increase the voltage between the gate and the emitter of the first switching element 4.

As explained above, according to the present embodiment, by raising the gate voltage of the switching element without the need to provide a negative power supply, it is possible to realize a cost reduction and space saving. In addition, according to the present embodiment, it is possible to achieve the abovementioned advantageous effects, regardless of the magnitude of the current flowing through the first switching element 4.

Fifth Embodiment

Figures 5, 6:
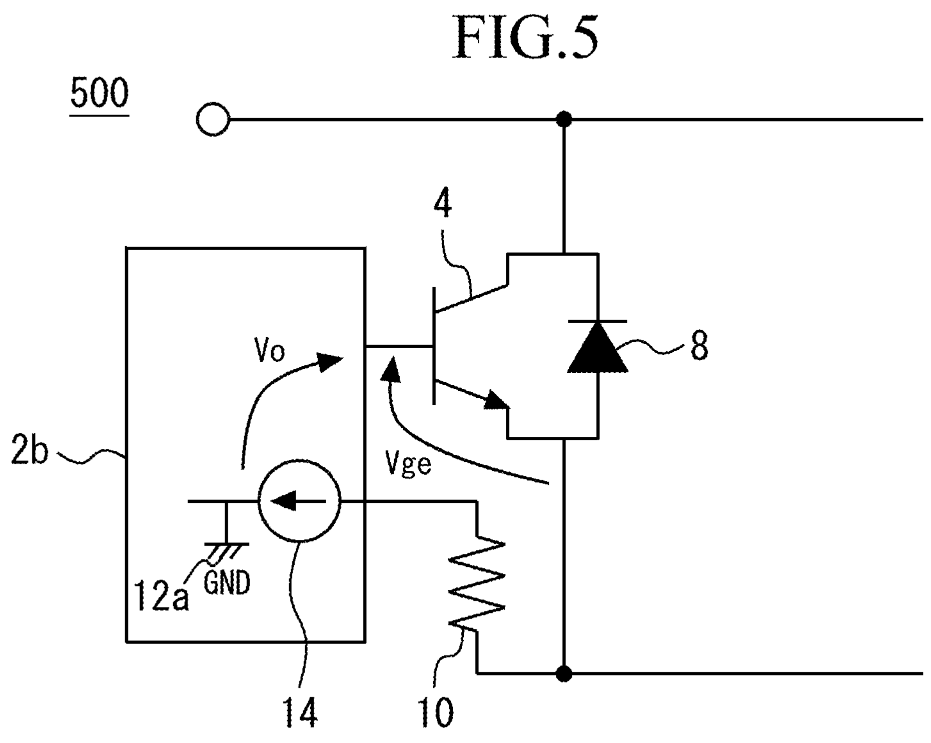
FIG. 5 is a drawing showing a semiconductor apparatus according to a fifth embodiment of the present disclosure.
FIG. 6 is a drawing showing a semiconductor apparatus according to a sixth embodiment of the present disclosure.

FIG. 5 is a drawing showing a semiconductor apparatus according to a fifth embodiment of the present disclosure. A semiconductor apparatus 500 is different from the semiconductor apparatus 400 for including, in place of the drive circuit 2*a*, a drive circuit 2*b* that causes a current inflow in the direction opposite from the direction caused by the drive circuit 2*a*.

An example of operations of the semiconductor apparatus 500 will be explained. When the drive circuit 2*b* outputs the ON signal voltage Vo for the first switching element 4, the first switching element 4 goes into an ON state. At the same time, the drive circuit 2*b* causes a current to flow in the direction from the GND terminal 12*a* toward the emitter of the first switching element 4, by employing the current source 14. As a result of the current flowing, a potential difference occurs between the two ends of the resistor 10.

In that situation, the emitter potential of the first switching element 4 is higher than the potential of the GND terminal 12*a*. Accordingly, Vo>Vge is true, where Vge denotes the gate voltage of the first switching element 4. Consequently, because the current which the first switching element 4 is able to cause to flow is suppressed, it is possible to prevent the first switching element 4 from being damaged.

As explained above, according to the present embodiment, by lowering the gate voltage of the switching element without the need to provide a negative power supply, it is possible to realize a cost reduction and space saving. In addition, according to the present embodiment, it is also possible to prevent the switching element from being damaged.

Sixth Embodiment

FIG. 6 is a drawing showing a semiconductor apparatus according to a sixth embodiment of the present disclosure. A semiconductor apparatus 600 is different from the semiconductor apparatus 200 for including a diode 16 connected in parallel to the resistor 10.

The diode 16 is a diode of which an anode is connected to the emitter of the first switching element 4*a*. Accordingly, in the present embodiment, there are two paths for turning on the gate of the first switching element 4*a*, namely, a path routed through the resistor 10 and another path routed through the diode 16. In other words, because it is possible to keep the resistance component small in each of the paths, it is possible to increase the speed of the switch-on of the first switching element 4*a*.

As explained above, according to the present embodiment, by raising the gate voltage of the switching element without the need to provide a negative power supply, it is possible to realize a cost reduction and space saving. In addition, according to the present embodiment, it is also possible to increase the speed of the switch-on.

Seventh Embodiment

Figure 7:
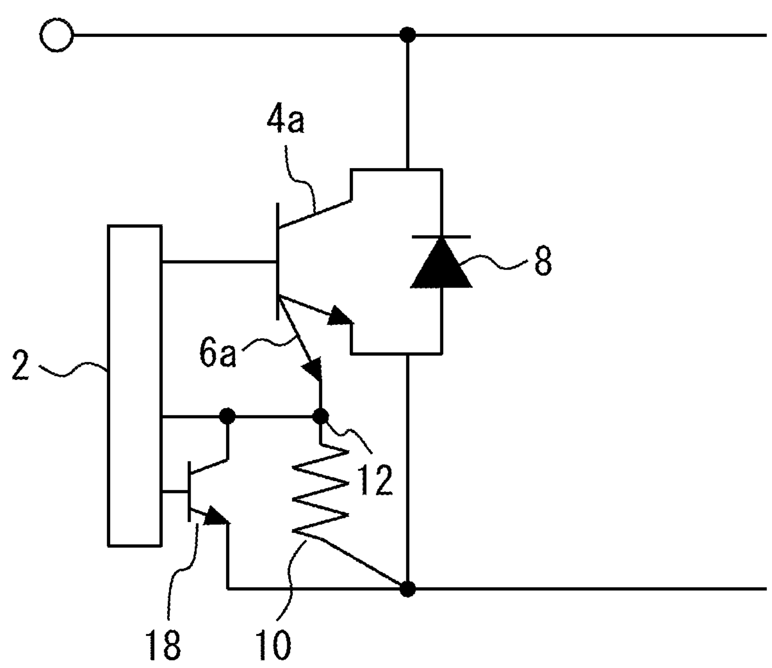
FIG. 7 is a drawing showing a semiconductor apparatus according to a seventh embodiment of the present disclosure.

FIG. 7 is a drawing showing a semiconductor apparatus according to a seventh embodiment of the present disclosure. A semiconductor apparatus 700 is different from the semiconductor apparatus 200 for including the third switching element 18. The third switching element 18 is a switching element which is connected in parallel to the resistor 10 and of which an emitter is connected to the emitter of the first switching element 4*a*.

In the semiconductor apparatus 700, at the time of turning off the first switching element 4*a* and the built-in second switching element 6*a*, the third switching element 18 is turned on. Accordingly, in the present embodiment, there are two paths for turning off the gate of the first switching element 4*a*, namely, a path routed through the resistor 10 and another path routed through the third switching element 18. In other words, because it is possible to keep the resistance component small in each of the paths, it is possible to increase the speed of the switch-off of the first switching element 4*a*.

As explained above, according to the present embodiment, by raising the gate voltage of the switching element without the need to provide a negative power supply, it is possible to realize a cost reduction and space saving. In addition, according to the present embodiment, it is also possible to increase the speed of the switch-off.

Eighth Embodiment

The semiconductor apparatus 100 to apparatus 700 are examples in which the switching elements are formed by using silicon. A semiconductor apparatus according to the present embodiment is different from the semiconductor apparatus 100 to apparatus 700 in that a switching element is formed by using a wide bandgap semiconductor. The wide bandgap semiconductor may be, for example, a gallium nitride-based material, a gallium oxide-based material, or diamond.

Wide bandgap semiconductors have higher heat tolerance than silicon. Accordingly, by forming the switching element by using a wide bandgap semiconductor, it is possible to have the semiconductor apparatus operate under a higher-temperature condition or to simplify a heat dissipation structure of the entire semiconductor apparatus.

Furthermore, wide bandgap semiconductors have smaller power loss than silicon. Accordingly, by forming the switching element by using a wide bandgap semiconductor, it is possible to have the semiconductor apparatus operate at a higher speed.

In addition, wide bandgap semiconductors have higher withstand voltage and higher allowable current density than silicon. Accordingly, by forming the switching element by using a wide bandgap semiconductor, it is possible to make the switching element more compact and to thus realize further space saving of the semiconductor apparatus.

In the present embodiment, it is desirable to form every switching element included in the semiconductor apparatus by using a wide bandgap semiconductor. It is, however, acceptable when at least one switching element is formed by using a wide bandgap semiconductor. In that situation also, it is possible to achieve the advantageous effects of the present embodiment.

Hereinafter, various aspects of the present disclosure will be collectively described as appendixes.

APPENDIX 1

A semiconductor apparatus comprising:

a first switching element including a high voltage terminal, a low voltage terminal, and a control terminal;

a second switching element being connected in parallel to the first switching element and including a high voltage terminal, a low voltage terminal, and a control terminal;

a drive circuit that drives the first switching element and the second switching element, by supplying a control signal based on potential of a GND terminal, to the control terminal of the first switching element and the control terminal of the second switching element; and a resistor connected between the low voltage terminal of the first switching element and the low voltage terminal of the second switching element, wherein the GND terminal of the drive circuit is connected between the low voltage terminal of the second switching element and the resistor.

APPENDIX 2

The semiconductor apparatus according to appendix 1, further comprising:

a diode which is connected in parallel to the resistor and of which an anode is connected to the low voltage terminal of the first switching element.

APPENDIX 3

The semiconductor apparatus according to appendix 1, further comprising:

a third switching element connected in parallel to the resistor, wherein at a time of turning off the first switching element and the second switching element, the drive circuit turns on the third switching element.

APPENDIX 4

The semiconductor apparatus according to any one of appendixes 1 to 3, wherein the second switching element is built in the first switching element.

APPENDIX 5

The semiconductor apparatus according to any one of appendixes 1 to 3, wherein the resistor is one of a coil and a wiring.

APPENDIX 6

A semiconductor apparatus comprising:

a first switching element including a high voltage terminal, a low voltage terminal, and a control terminal;

a drive circuit that drives the first switching element, by supplying a control signal based on potential of a GND terminal, to the control terminal of the first switching element; and a resistor connected between the low voltage terminal of the first switching element and the GND terminal of the drive circuit, wherein the drive circuit has a current source that causes a current to flow through the resistor in a direction from the GND terminal toward the low voltage terminal.

APPENDIX 7

A semiconductor apparatus comprising:

a first switching element including a high voltage terminal, a low voltage terminal, and a control terminal;

a drive circuit that drives the first switching element, by supplying a control signal based on potential of a GND terminal, to the control terminal of the first switching element; and a resistor positioned between the low voltage terminal of the first switching element and the GND terminal of the drive circuit, wherein the drive circuit has a current source that causes a current to flow through the resistor in a direction from the low voltage terminal toward the GND terminal.

APPENDIX 8

The semiconductor apparatus according to any one of appendixes 1 to 3, 6, and 7, wherein the first switching element is formed by using a wide bandgap semiconductor.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2024-008600, filed on Jan. 24, 2024 including specification, claims, drawings and summary, on which the Convention priority of the present application is based, are incorporated herein by reference in its entirety.

The invention claimed is:

1. A semiconductor apparatus comprising:

a first switching element including a high voltage terminal, a low voltage terminal, and a control terminal;

a second switching element being connected in parallel to the first switching element and including a high voltage terminal, a low voltage terminal, and a control terminal;

a drive circuit that drives the first switching element and the second switching element, by supplying a control signal based on potential of a GND terminal, to the control terminal of the first switching element and the control terminal of the second switching element; and a resistor connected between the low voltage terminal of the first switching element and the low voltage terminal of the second switching element, wherein the GND terminal of the drive circuit is connected between the low voltage terminal of the second switching element and the resistor.

2. The semiconductor apparatus according to claim 1, further comprising:

a diode which is connected in parallel to the resistor and of which an anode is connected to the low voltage terminal of the first switching element.

3. The semiconductor apparatus according to claim 2, wherein the second switching element is built in the first switching element.

4. The semiconductor apparatus according to claim 2, wherein the resistor is one of a coil and a wiring.

5. The semiconductor apparatus according to claim 2, wherein the first switching element is formed by using a wide bandgap semiconductor.

6. The semiconductor apparatus according to claim 1, further comprising:

a third switching element connected in parallel to the resistor, wherein at a time of turning off the first switching element and the second switching element, the drive circuit turns on the third switching element.

7. The semiconductor apparatus according to claim 6, wherein the second switching element is built in the first switching element.

8. The semiconductor apparatus according to claim 6, wherein the resistor is one of a coil and a wiring.

9. The semiconductor apparatus according to claim 6, wherein the first switching element is formed by using a wide bandgap semiconductor.

10. The semiconductor apparatus according to claim 1, wherein the second switching element is built in the first switching element.

11. The semiconductor apparatus according to claim 1, wherein the resistor is one of a coil and a wiring.

12. The semiconductor apparatus according to claim 1, wherein the first switching element is formed by using a wide bandgap semiconductor.

* * * * *